United States Patent [19]

Komatsu

[11] Patent Number: 4,467,312
[45] Date of Patent: Aug. 21, 1984

[54] SEMICONDUCTOR RESISTOR DEVICE

[75] Inventor: Shigeru Komatsu, Yokohama, Japan

[73] Assignee: Tokyo Shibaura Denki Kabushiki Kaisha, Kawasaki, Japan

[21] Appl. No.: 324,954

[22] Filed: Nov. 24, 1981

[30] Foreign Application Priority Data

Dec. 23, 1980 [JP] Japan ............... 55-191320

[51] Int. Cl.³ ............................. H01C 7/012
[52] U.S. Cl. ..................... 338/309; 29/577 C; 148/1.5; 219/121 LM; 338/195; 357/51; 427/82; 427/103
[58] Field of Search ......... 338/308, 309, 320, 195; 29/520, 571, 577 R, 577 C; 427/82, 103, 124, 126; 219/121 LM, 543; 357/36, 50, 51, 53; 148/1.5

[56] References Cited

U.S. PATENT DOCUMENTS

| 3,381,256 | 4/1968 | Schuller et al. | 338/309 |
| 3,474,304 | 10/1969 | Currin et al. | 338/309 X |
| 3,649,945 | 3/1972 | Waits | 338/309 |
| 3,700,977 | 10/1972 | Lunn | 357/51 |
| 3,702,955 | 11/1972 | Kalb et al. | 357/51 X |
| 3,740,621 | 6/1973 | Carley | 357/51 |
| 3,849,757 | 11/1974 | Khammous | 338/320 |
| 3,947,801 | 3/1976 | Bubc | 338/308 |
| 3,996,551 | 12/1976 | Croson | 338/309 |
| 4,001,762 | 1/1977 | Aoki et al. | 338/309 |
| 4,179,310 | 12/1979 | Compton et al. | 148/1.5 |
| 4,258,380 | 3/1981 | Roger | 357/51 |
| 4,270,137 | 5/1981 | Coe | 357/53 |
| 4,272,776 | 6/1981 | Weijland et al. | 357/50 |
| 4,288,530 | 9/1981 | Bedard et al. | 430/315 |
| 4,291,326 | 9/1981 | Higuchi et al. | 357/51 |
| 4,416,049 | 11/1983 | McElroy | 29/571 |

FOREIGN PATENT DOCUMENTS 2837315 3/1979 Fed. Rep. of Germany.
2849716 5/1980 Fed. Rep. of Germany.

OTHER PUBLICATIONS

IBM Technical Disclosure Bulletin, vol. 17, No. 10, Mar. 1975, p. 2878.
IBM Technical Disclosure Bulletin, vol. 21, No. 8, Jan. 1979, pp. 3271 and 3272.
IBM Technical Disclosure Bulletin, vol. 21, No. 3, Aug. 1978, pp. 1124 and 1125.

Primary Examiner—Volodymyr Y. Mayewsky
Attorney, Agent, or Firm—Finnegan, Henderson, Farabow, Garrett & Dunner

[57] ABSTRACT

A semiconductor resistor device comprising a resistor region diffused in the surface area of a semiconductor substrate, resistor electrodes respectively ohmically contacted to the surface of the resistor region, and a protective layer coated on the surfaces of the resistor electrodes. A trimming electrode is provided which is ohmically contacted to the surface of the resistor region to alloy with the resistor and a hole is formed in that portion of the protective layer which faces the trimming electrode. Where laser pulses are emitted to the trimming electrode through the hole, the trimming electrode is alloyed with the resistor region to reduce the resistance of the resistor region.

8 Claims, 4 Drawing Figures

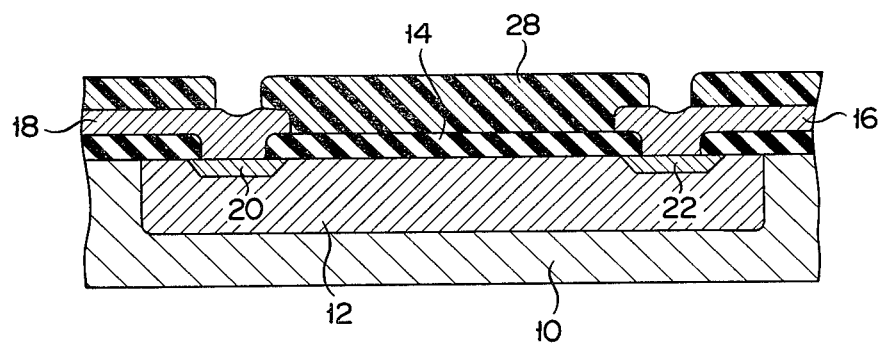

SEMICONDUCTOR RESISTOR DEVICE

BACKGROUND OF THE INVENTION

This invention relates to a semiconductor resistor device, and more particularly to a semiconductor resistor device which can trim resistance with a high precision.

With a digital-analog converter or analog-digital converter, a precise resistance value generally determines the reliability of the converter circuit. Therefore, a resistor of high precision is required for such converter. However, a thin resistor device of the hybrid type proposed to date for this object has the drawbacks that the resistor device has a low moisture proof property and is manufactured by a complicated process. On the other hand, a diffusion type resistor or polycrystalline silicon resistor manufactured during the conventional semiconductor-manufacturing process must be allowed to have variations of at least about 0.4% in resistance value in consideration of deviations occurring in the factors involved in the conventional semiconductor device-manufacturing process. Yet, the above-mentioned type of resistor has the advantage that it can be easily manufactured at low cost. At present, therefore, this type of resistor is still put to practical application by trimming its resistance value. One of the known resistor-trimming processes comprises connecting a plurality of diffusion type resistors in parallel by electrode metals of, for example, aluminum, and cutting the intervening electrode metals by laser beams, thereby raising the resistance of the portion including all the diffusion type resistors to a prescribed level. Another known resistor-trimming process comprises destroying part of a polycrystalline silicon resistor by laser beams. However, the above-mentioned conventional resistor-trimming processes destroy part of an electrode metal or semiconductor device by high output laser beams, presenting difficulties in assuring the reliability of a resistor device as a whole, and further imposing certain limitations on the construction of the resistor device.

SUMMARY OF THE INVENTION

It is accordingly the object of this invention to provide a semiconductor resistor device of high reliability whose resistance value can be trimmed with a high precision. To attain the above-mentioned object, this invention provides a semiconductor resistor device comprising a semiconductor region formed near the sruface area of a semiconductor substrate to provide a resistor, an electrode metal ohmically contacted to the surface of the semiconductor region, and a metal ohmically contacted to the surface of the semiconductor region for alloying with the semiconductor region.

BRIEF DESCRIPTION OF THE DRAWING

FIGS. 1 to 4 are the sectional views of semiconductor resistor devices according to different embodiments of this invention.

DETAILED DESCRIPTION OF THE PREFERRED EMBODIMENTS

Figure 1:
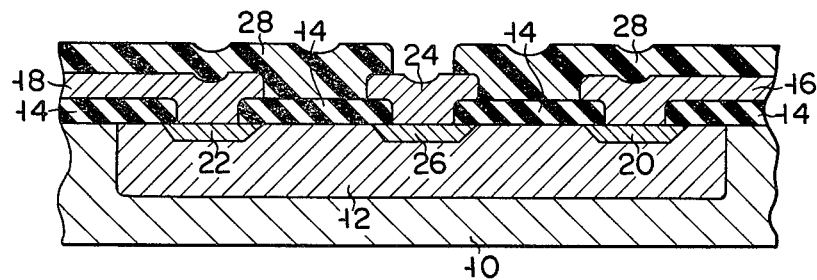

Description is now given with reference to FIG. 1 of a semiconductor resistor device according to a first embodiment of this invention. Referring to FIG. 1, a P-type silicon resistor region 12 is diffused in the surface area of an N-type silicon substrate 10. A silicon oxidized ($SiO_2$) layer 14 is deposited on the surfaces of the substrate 10 and resistor region 12. The resistor region 12 generally has a rectangular surface. Two holes are formed in the $SiO_2$ layer 14 mounted on both end portions of the resistor region 12, respectively. Aluminum or aluminum alloy electrodes 16 and 18 used as resistor electrodes are respectively ohmically contacted to the both end portions of the resistor region 12 through the corresponding holes. This ohmic contact causes alloy layers 20 and 22 to be respectively formed in the corresponding junctions between the resistor region 12 and resistor electrodes 16 and 18. A hole is also formed in the oxidized layer 14 mounted on the upper part of the central portion of the resistor region 12. A trimming electrode 24 formed of a metal alloying with silicon, like the resistor electrode, is ohmically contacted to the resistor region 12 through the hole. An alloy layer 26 is also produced in the junction between the trimming electrode 24 and resistance region 12. The trimming electrode 24 is formed of a metal selected from the group consisting of aluminum, aluminum alloy, platinum, titanium, etc. A protective layer 28 is coated on the surfaces of the oxidized layer 14, resistor electrodes 16 and 18 and trimming electrode 24. The protective layer 28 is produced by the chemical vapor deposition (CVD) of $SiO_2$ or application of polyimide. A hole is formed in that portion of the protective layer 28 which is positioned on the trimming electrode 24.

Where, after the above-mentioned construction of the resistor device, laser beams are emitted to the trimming electrode 24 though the hole of the protective layer 28, then alloying between the trimming electrode 24 and resistor region 12 proceeds to enlarge the alloy layer 26. The enlargement of the alloy layer 26 decreases the resistance of the resistance region 12. If, therefore, laser pulses are emitted to the trimming electrode 24 for the growth of the alloy layer 26, while measuring the resistance of the resistance region 12, then it is possible to obtain a desired level of resistance. The laser pulses which are simply intended to effect alloying between the semiconductor resistor and trimming electrode instead of destroying the semiconductor resistor, thereby, they only produce a low output (for example, about 500° C.). The hole of the protective layer 28 is intended to assure the effective emission of the laser pulses to the trimming electrode 24 and prevent the protective layer 28 from being damaged by the heat of the laser pulses. If the power level of the laser pulses is extremely low, then the resistor device can be trimmed to an extent of several ohms. With the above-mentioned embodiment, resistance can be trimmed downward. Where, therefore, trimming is carried out on a resistor circuit which is damaged to have the so-called pair characteristic, it is advised to trim the resistance values of the resistor circuit to a minimum level thereof.

The aforementioned embodiment can trim the resistance of a semiconductor resistor device by alloying a semiconductor, instead of destroying part thereof, thereby providing a semiconductor resistor device of high precision and high reliability.

Description is now given of a semiconductor resistor device according to a second embodiment of this invention. The parts of the second embodiment the same as those of the first embodiment are denoted by the same numerals, description thereof being omitted. The second embodiment of FIG. 2 is different from the first embodiment only in that the resistor is not produced by diffusion, but is formed by depositing an impuritydoped polycrystalline silicon layer 30 on the insulating layer 14 mounted on the semiconductor substrate 10.

Figure 2:
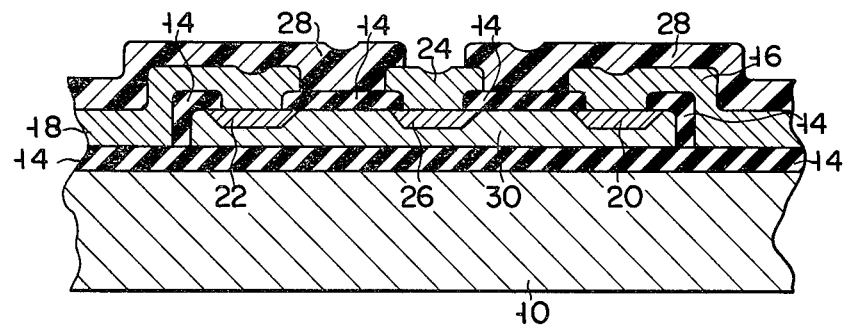
Figure 3:
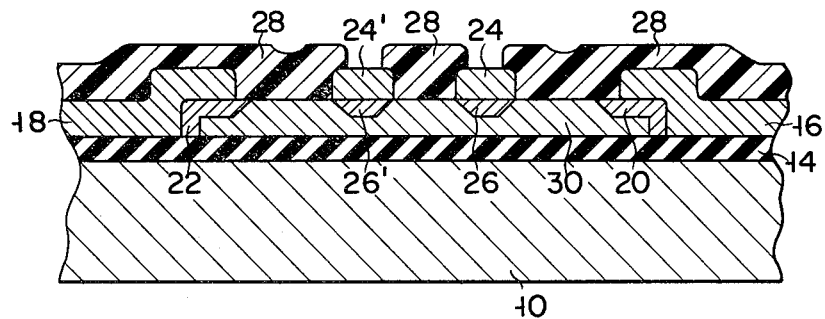

A semiconductor resistor device of FIG. 3 according to a third embodiment of the invention is different from the second embodiment of FIG. 2 in that no insulation layer 14 is provided between the polycrystalline silicon layer 30 and the resistor electrode 16, as well as between the polycrystalline silicon layer 30 and the resistor electrode 18, and that two trimming electrodes 24 and 24' are provided. Not only with the diffusion type resistor, but also with the polycrystalline silicon resistor, alloying can accurately trim the resistance of the resistor device. As in the third embodiment of FIG. 3, it is possible to provide a plurality of trimming electrodes.

This invention is not limited to the above-mentioned embodiments. But the invention can be practiced with various changes and modifications, for example, by varying the type of resistor. Further, resistance can be trimmed by directly emitting laser pulses to the resistor electrodes 16 and 18 without providing a trimming as shown in FIG. 4.

What is claimed is:

1. A semiconductor resistor device which comprises:
   a semiconductor substrate;
   a semiconductor resistor region formed near the surface area of said semiconductor substrate, said resistor region including alloyed contact regions;
   conductive electrodes each ohmically in contact with the surface of said semiconductor region only at individual ones of said alloyed contact regions; and
   a trimming electrode ohmically in contact with the surface of said semiconductor region only at another of said alloyed contact regions between said electrodes for decreasing the resistance of said resistor regions.

2. The semiconductor resistor device according to claim 1, wherein the surfaces of said semiconductor region and conductive electrodes are covered with a protective layer and a hole is formed in that portion of said protective layer which faces the surface of said trimming electrode.

3. The semiconductor resistor device according to claim 1, wherein said trimming electrode is further alloyed with said semiconductor region when exposed to a laser beam.

4. A semiconductor resistor device which comprises:
   a semiconductor substrate;
   a semiconductor resistor region formed near the surface area of said substrate, said resistor region including alloyed contact regions; and
   conductive electrodes ohmically in contact with the surface of the semiconductor region only at individual ones of said alloyed contact regions, said contact regions being further alloyed by exposure of the conductive electrodes to a laser beam for decreasing the resistance of said resistor region.

5. The semiconductor resistor device according to claim 4, wherein said semiconductor region is diffused in the surface area of said semiconductor substrate.

6. The semiconductor resistor device according to claim 4, wherein said semiconductor region is a polycrystalline semiconductor layer deposited above said semiconductor substrate with an insulation layer interposed therebetween.

7. The semiconductor resistor device according to claim 4, wherein said semiconductor region is formed of silicon, and said conductive electrodes and trimming electrode are formed of a material selected from the group consisting of aluminum, aluminum alloy, platinum and titanium.

8. A device according to claim 8, wherein the surfaces of said semiconductor region and conductive electrodes are covered with a protective layer, and holes are formed in those portions of the protective layer which face the contact regions of said semiconductor region.

* * * * *